US010090094B2

(12) United States Patent
Bolognia et al.

(10) Patent No.: US 10,090,094 B2
(45) Date of Patent: Oct. 2, 2018

(54) FLEX-BASED SURFACE MOUNT TRANSFORMER

(71) Applicant: Analog Devices, Inc., Norwood, MA (US)

(72) Inventors: David Bolognia, Charlestown, MA (US); Vikram Venkatadri, Ayer, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/174,477

(22) Filed: Jun. 6, 2016

(65) Prior Publication Data
US 2017/0352469 A1 Dec. 7, 2017

(51) Int. Cl.
*H01F 5/00* (2006.01)
*H01F 27/28* (2006.01)
*H01F 27/29* (2006.01)
*H01F 41/04* (2006.01)
*H01F 41/10* (2006.01)
*H05K 3/30* (2006.01)
*H01F 27/30* (2006.01)

(52) U.S. Cl.
CPC ........... *H01F 27/2804* (2013.01); *H01F 5/00* (2013.01); *H01F 27/2895* (2013.01); *H01F 27/292* (2013.01); *H01F 27/306* (2013.01); *H01F 41/041* (2013.01); *H01F 41/10* (2013.01); *H05K 3/303* (2013.01)

(58) Field of Classification Search
CPC .................. H01F 5/00; H01F 27/00–27/36
USPC ........................................... 336/65, 200, 232
See application file for complete search history.

(56) References Cited

U.S. PATENT DOCUMENTS 4,755,783 A 7/1988 Fleischer et al.
5,465,272 A 11/1995 Smith
(Continued)

FOREIGN PATENT DOCUMENTS

TW 486901 5/2002
WO WO-2017068423 A1 4/2017
WO 2017205478 11/2017

OTHER PUBLICATIONS

"U.S. Appl. No. 15/164,267, Final Office Action dated Nov. 2, 2017", 26 pgs.
(Continued)

*Primary Examiner* — Tuyen Nguyen
(74) *Attorney, Agent, or Firm* — Schwegman Lundberg & Woessner, P.A.

(57) ABSTRACT

A transformer can include a flexible substrate having at least a first conductive layer and a dielectric layer. The transformer can further include an unbroken toroidal core of a magnetic material. The magnetic material can include material with a relative magnetic permeability greater than unity. The substrate can include a plurality of planar extensions arranged to provide respective windings encircling the core when the planar extensions are folded and attached back to another region of the substrate. Adjacent windings can be conductively isolated from each other. The flexible substrate can further include a second conductive layer separated from the first conductive layer by the dielectric layer. The first conductive layer and the second conductive layer can be coupled via a plurality of interconnects so that the respective windings are formed when the planar extensions are folded and attached back to the another region of the substrate.

20 Claims, 8 Drawing Sheets

(56) References Cited

U.S. PATENT DOCUMENTS

| | | | |
|---|---|---|---|
| 5,994,998 | A | 11/1999 | Fisher et al. |
| 6,408,032 | B1 | 6/2002 | Lye et al. |
| 6,433,608 | B1 | 8/2002 | Huang |
| 6,541,878 | B1 | 4/2003 | Diab |
| 6,573,820 | B2 * | 6/2003 | Yamada .............. H01F 27/2804 336/184 |
| 6,841,855 | B2 | 1/2005 | Jaeck et al. |
| 7,136,421 | B2 | 11/2006 | Lin et al. |
| 7,215,720 | B2 | 5/2007 | Yeh |
| 7,218,687 | B2 | 5/2007 | Huang et al. |
| 7,304,863 | B1 | 12/2007 | Wu |
| 7,445,507 | B1 | 11/2008 | Parker |
| 7,697,251 | B2 | 4/2010 | Karam |
| 7,944,668 | B2 | 5/2011 | Huang et al. |
| 8,098,768 | B2 | 1/2012 | Langner et al. |
| 8,543,190 | B2 | 9/2013 | Wasson et al. |
| 9,491,008 | B2 | 11/2016 | Dong |
| 9,906,211 | B2 | 2/2018 | Fernández Robayna |
| 2008/0136256 | A1 | 6/2008 | Gattani |
| 2008/0137759 | A1 | 6/2008 | Cai et al. |
| 2008/0159414 | A1 | 7/2008 | Brecher et al. |
| 2008/0159415 | A1 | 7/2008 | Miller et al. |
| 2009/0202003 | A1 | 8/2009 | Langner et al. |
| 2009/0207538 | A1 | 8/2009 | Crawley et al. |
| 2010/0150285 | A1 | 6/2010 | Tazebay et al. |
| 2011/0285492 | A1 * | 11/2011 | Wang .................... H01F 27/306 336/198 |
| 2013/0339765 | A1 | 12/2013 | Diab |
| 2014/0232502 | A1 | 8/2014 | Gutierrez et al. |
| 2017/0250682 | A1 | 8/2017 | Fernández Robayna |
| 2017/0346661 | A1 | 11/2017 | Mccarthy et al. |

OTHER PUBLICATIONS

"U.S. Appl. No. 15/226,564, Notice of Allowance dated Nov. 7, 2017", 5 pgs.

"International Application Serial No. PCT/US2017/034202, International Search Report dated Sep. 14, 2017", 6 pgs.

"International Application Serial No. PCT/US2017/034202, Written Opinion dated Sep. 14, 2017", 6 pgs.

"Ethernet Protection Design Guide", Littelfuse, Inc., (2015), 1-32.

Siegel, Adam C., "Foldable Prrinted Circuit Boards on Paper Substrates", Advanced Function Materials, 20, (2010), 28-35.

Weon, Dae-Hee, et al., "3-D Integrated Inductors and Transformers on Liquid Crystal Polymer Substrate", IEEE, (2006), 1381-1384.

"U.S. Appl. No. 15/226,564, Non Final Office Action dated Dec. 23, 2016", 11 pgs.

"U.S. Appl. No. 15/226,564, Response filed Feb. 2, 2017 to Non Final Office Action dated Dec. 23, 2016", 13 pgs.

"U.S. Appl. No. 15/226,564, Examiner Interview Summary dated Feb. 6, 2017", 3 pgs.

"U.S. Appl. No. 15/226,564, Notice of Allowance dated Mar. 3, 2017", 6 pgs.

"U.S. Appl. No. 15/164,267, Non Final Office Action dated Jun. 9, 2017", 20 pgs.

"U.S. Appl. No. 15/164,267, Response filed Jul. 20, 2017 to Non Final Office Action dated Jun. 9, 2017", 11 pgs.

"U.S. Appl. No. 15/164,267, Examiner Interview Summary dated Jan. 10, 2018", 3 pgs.

"U.S. Appl. No. 15/164,267, Response filed Jan. 9, 2018 to Final Office Action dated Nov. 2, 2017", 12 pgs.

"U.S. Appl. No. 15/164,267, Examiner Interview Summary dated Jul. 17, 2017", 3 pgs.

"U.S. Appl. No. 15/164,267, Non Final Office Action dated Feb. 2, 2018", 27 pgs.

"International Application Serial No. PCT/IB2016/001629, International Search Report dated Feb. 28, 2017", 4 pgs.

"International Application Serial No. PCT/IB2016/001629, Written Opinion dated Feb. 28, 2017", 5 pgs.

"International Application Serial No. PCT IB2016 001629, International Preliminary Report on Patentability dated May 3, 2018", 7 pgs.

"U.S. Appl. No. 15/164,267, Response filed Apr. 20, 2018 to Non Final Office Action dated Feb. 2, 2018", 11 pgs.

* cited by examiner

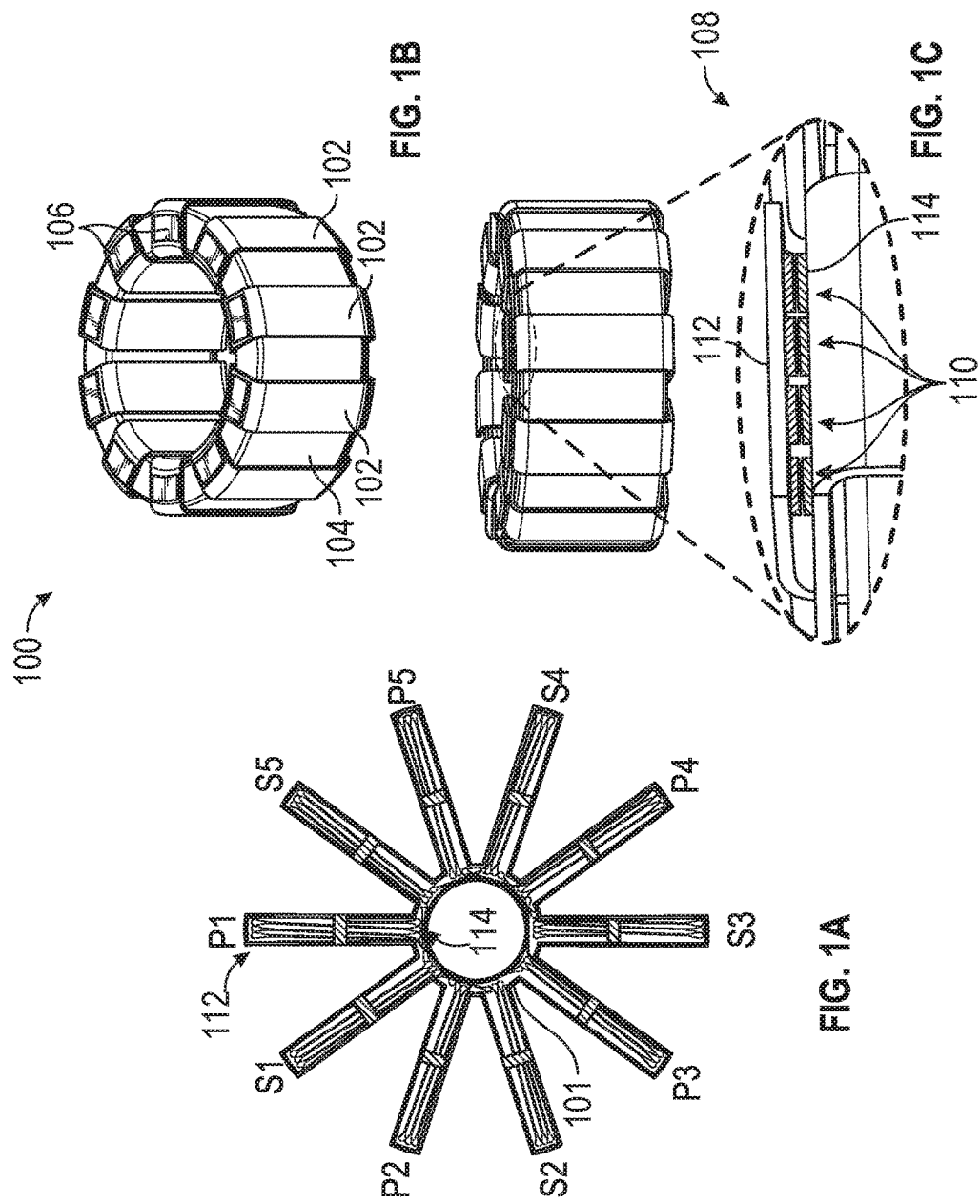

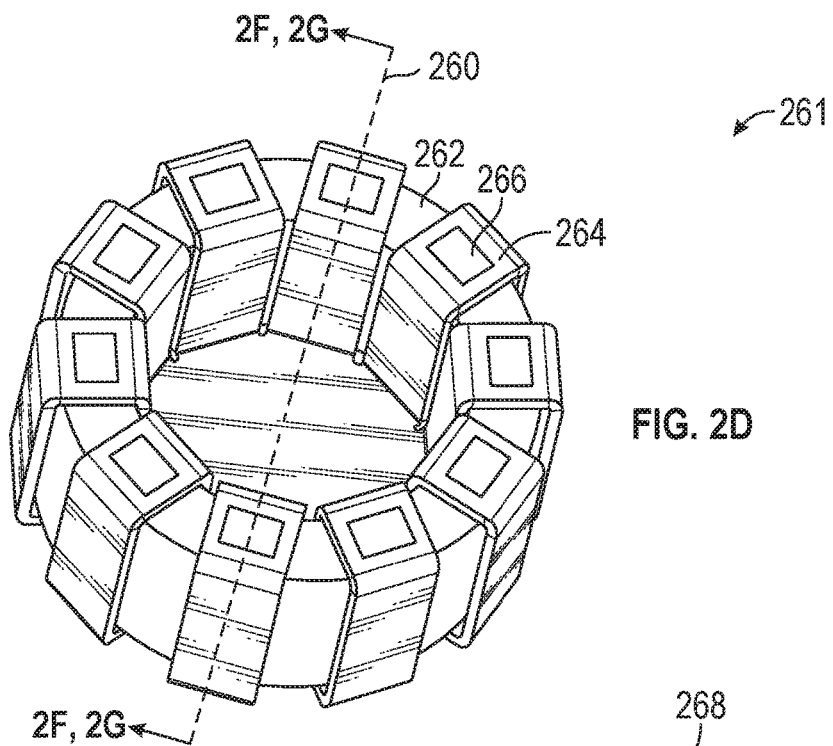
FIG. 2D
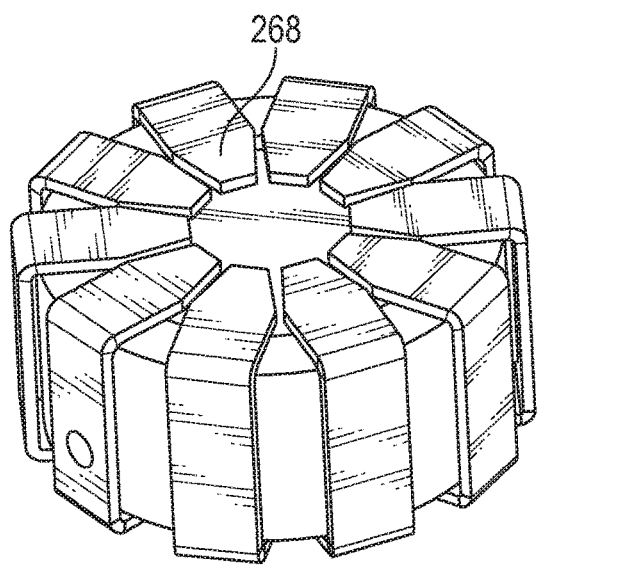
FIG. 2E
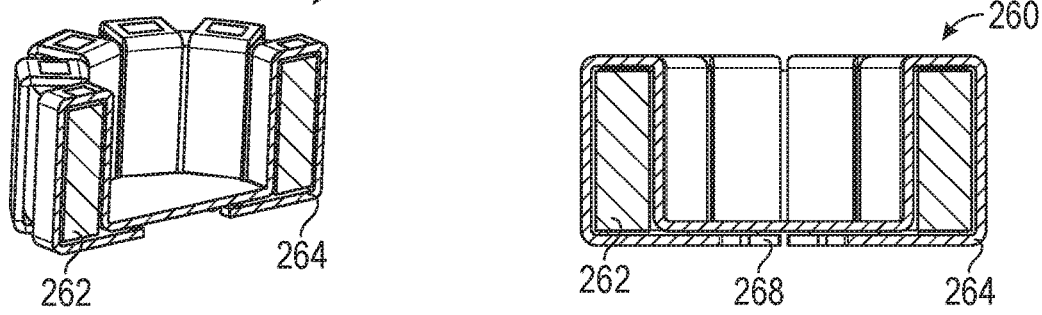
FIG. 2F
FIG. 2G

FLEX-BASED SURFACE MOUNT TRANSFORMER

BACKGROUND

The present disclosure relates to the field of transformer devices and related fabrication techniques.

Transformers are devices that are used to change the voltage of alternating current. In one approach, a manufacturing process for a transformer includes winding coils of wire around a magnetic core. For example, one coil can function as the "primary" winding (e.g., where input voltage is supplied) and a second coil can function as the "secondary" winding (e.g., where output voltage is provided by the transformer). Because coil winding can be a time-consuming process, commercial transformer design is primarily driven by cost. Coil-winding is generally performed manually or using a semi-automated process. The resultant coil may be manually handled and assembled, which is not convenient for high volume manufacturing.

Further complications arise in the area of miniaturized radio frequency (RF) circuitry, such as where the use of discrete passive surface-mount devices can result in a circuit board footprint that is larger than other circuit applications, particularly because of a footprint of magnetic devices such as inductors or transformers. Generally-available surface mount transformers use external leads. During assembly, such leads may be hand-soldered to the circuit board assembly. Such leads may also be hand-soldered internally to respective windings such as through an interposer. Accordingly, a transformer device having such a leaded construction can consume a much larger footprint than other devices such as integrated circuits included as a portion of a printed circuit board assembly.

SUMMARY

The present inventors have recognized, among other things, that a need exists for a cost-effective and high-volume manufacturing solution for dense integration of wire-wound transformers/coils, such as within device packages or integrated circuit modules. A flex-based surface mount transformer with round ferrite can address a physical volume and cost scalability challenges, such as in relation integration of such a transformer within a semiconductor package. As an example, a flexible (flex)-based substrate including conductive regions can be used to form the windings/wires of the transformer by wrapping around a magnetic core body (e.g., a toroidal ferrite), and bonding to itself or another substrate to complete individual circuits comprising the windings.

A flex substrate can include multiple conductive layers, such as including fine conductive lines or traces, so that an unbroken (e.g., round/toroidal) ferrite can be used as a magnetic core (such as rather than an "E-core" or other broken core configuration). After the windings are formed, the flex circuit or other assembly can include pads, such as to facilitate use of the transformer in a surface-mount technology (SMT) application. For example, input/output (I/O) pads (e.g., solder pads, bumps, or lands) can be placed on an outside surface of a flexible substrate or other portion of a transformer assembly including flexible substrate, resulting in convenient I/O terminals integrated on the outside surface of the transformer. The I/O pads can be used for epoxy or solder attachment (as illustrative examples) and integration on a circuit board. The flex-based transformer with an integrated I/O solution can be also used with automatic pick-and-place circuit assembly technologies, as well as reflow at the second level assembly process.

In an example, an inductive device can include a flexible substrate having at least a first conductive layer and a dielectric layer. The inductive device can further include a core of a magnetic material. A first planar extension of the flexible substrate can be arranged to provide a first conductive winding encircling a cross section of the core. The first conductive winding can be defined at least in part on the first conductive layer when the first planar extension of the flexible substrate is folded over the core such that a portion of the first planar extension attaches back to another region of the substrate. A second planar extension of the substrate, separate from the first planar extension of the flexible substrate, can be arranged to provide a second conductive winding encircling the cross section of the core. The second conductive winding can be defined at least in part on the first conductive layer when the second planar extension of the flexible substrate is folded over the core such that a portion of the second planar extension also attaches back to another region of the substrate.

In another example, a transformer can include a flexible substrate having at least a first conductive layer and a dielectric layer. The transformer can further include an unbroken toroidal core of a magnetic material. The magnetic material can include material with a relative magnetic permeability greater than unity. The substrate can include a plurality of planar extensions arranged to provide respective windings encircling the core when the planar extensions are folded and attached back to another region of the substrate. Adjacent windings can be conductively isolated from each other. The flexible substrate can further include a second conductive layer separated from the first conductive layer by the dielectric layer. The first conductive layer and the second conductive layer can be coupled via a plurality of interconnects so that the respective windings are formed when the planar extensions are folded and attached back to another region of the substrate.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 1A illustrates generally an example that can include a "decapod" (10-prong) flexible assembly for a flex-based transformer.

FIG. 1B and FIG. 1C illustrate views of a flex-based transformer assembly including the flexible assembly and a toroidal magnetic core, with FIG. 1C showing self-attachment of portions of the flexible assembly to form respective windings.

FIG. 2D, FIG. 2E, FIG. 2F and FIG. 2G illustrate various views of another example flex-based transformer that is different from the transformer in FIG. 1B.

Figure 2B:
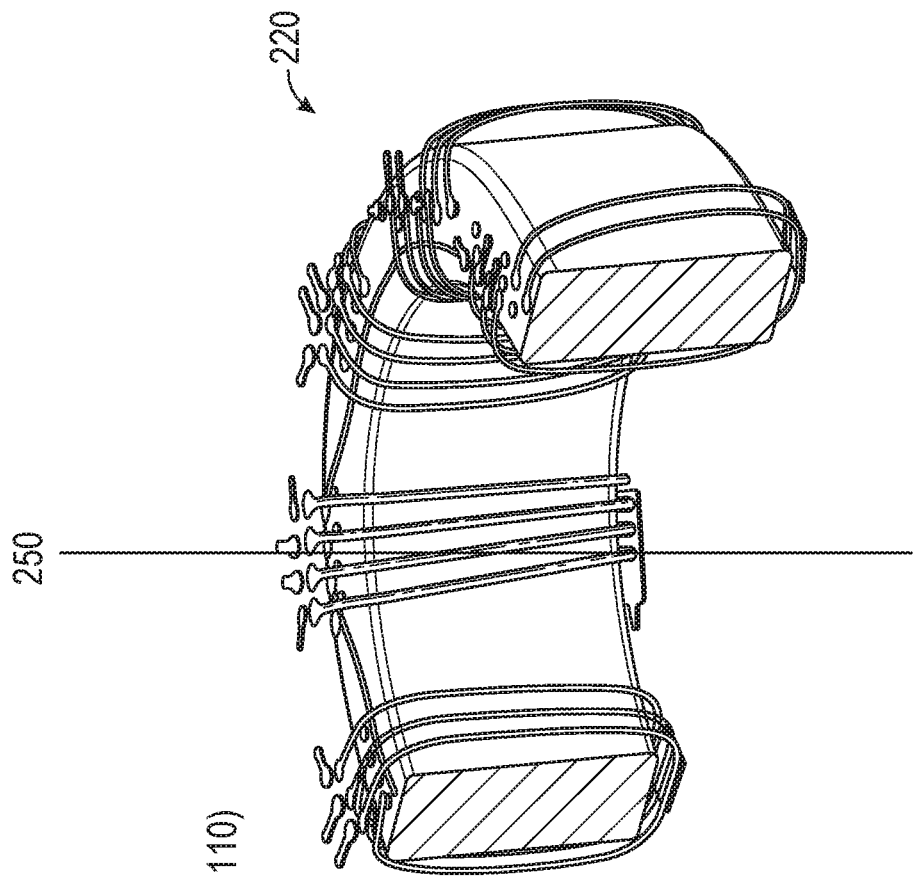
FIG. 2A and FIG. 2B illustrate generally an example cross-sectional view and a perspective view of the flex-based transformer of FIG. 1B, respectively.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1A illustrates generally an example that can include a "decapod" (10-prong) flexible assembly for a flex-based transformer. FIG. 1B and FIG. 1C illustrate views of a flex-based transformer assembly including the flexible assembly and a toroidal magnetic core, with FIG. 1C showing self-attachment of portions of the flexible assembly to form respective windings. Referring to FIG. 1A, FIG. 1B, and FIG. 1C, the flex-based transformer 100 can include a flexible substrate (or flex) 101 that is wrapped around a magnetic core 104 (e.g., a toroidal ferrite). The magnetic core 104 can include magnetic material with a relative magnetic permeability greater than unity (e.g., ferrite core). Other magnetic materials can be used, such as ferromagnetic materials including steel, iron, or mu-metal, such as depending on the desired frequency range and loss characteristics for a particular transformer or inductor application. The use of an unbroken toroidal core is illustrative. Other core configurations can be used (such as an elliptical or rectangular core configuration).

In an example, the flex 101 can be a decapod flex with 10 prongs (or planar extensions) 102. The flex 101 can include multiple layers (e.g., one or more metallic/conductive layers and a dielectric/isolation layer), such as illustrated in the examples in FIGS. 2A-2B and 3A-3D. Even though the flex 101 is illustrated with 10 planar extensions (or prongs), the disclosure is not limited in this regard and other flex designs can be used (e.g., an octopod flex 204 with 8 prongs, as seen in FIG. 2C).

In an example, each of the planar extensions of the flex 101 can be associated with a primary or a secondary winding of the transformer 100. More specifically, the transformer 100 includes a primary winding with five interconnected winding portions (one on each planar extension), referenced as P1 through P5. Similarly, the transformer 100 also includes a secondary winding with five interconnected winding portions, referenced as S1 through S5. After each of the planar extensions 102 is folded over the core 104, one portion of the planar extension can attach to another portion of the planar extension, effectively closing the winding associated with (and disposed on) that planar extension. In the illustrative example in FIG. 1A, the winding portions P1 through P5 are interconnected to form a continuous primary winding, and the winding portions S1 through S5 are interconnected to form a continuous secondary winding. Even though the primary and secondary winding portions are interleaved in the flex 101, the present disclosure is not limited in this regard and other primary-secondary winding configurations can be used in a flex.

The attachment and closing of a planar extension of the flex is illustrated in view 108. After the magnetic core is placed on the circular base of the flex 101, the planar extension (e.g., P1) can be folded over so that a distal portion 112 of the planar extension attaches to a proximal portion 114 of the same planar extension using connecting pads 110. In an example, the flex 101 can include a top conductive layer and a bottom conductive layer, isolated by a dielectric (as seen in FIG. 2A). After a flex planar extension is folded over, the connecting pads can be used to achieve a connection between the top and bottom conductive layers, so as to form a winding associated with the planar extension. The connecting pads can be metal interconnects, anisotropic conductive film (ACF), solder, conductive paste or the like.

In an example, input/output (I/O) terminals for the primary and secondary windings can be attached to, e.g., solder pads 106 on the planar extensions. As seen in FIG. 1B, one solder pad can be used per planar extension, with each solder pad positioned on an outside surface of the transformer 100 after all the planar extensions are folded over the core 104. In some instances, two solder pads can be used for I/O terminals for the primary winding, two solder pads can be used for I/O terminals of the secondary winding, and another two solder pads can be used as center taps (one for the primary and one for the secondary winding). Other solder pads can be left unused for electrical connections but can be used to aid in mechanically fixing or anchoring the transformer assembly (e.g., on a circuit board).

Figure 2A:
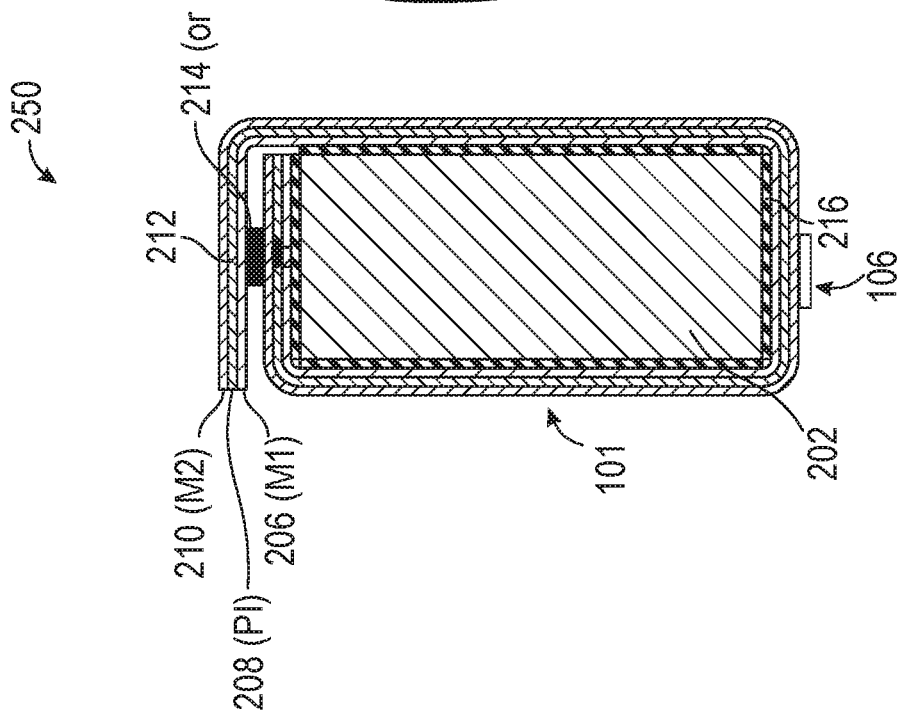
Figure 2C:
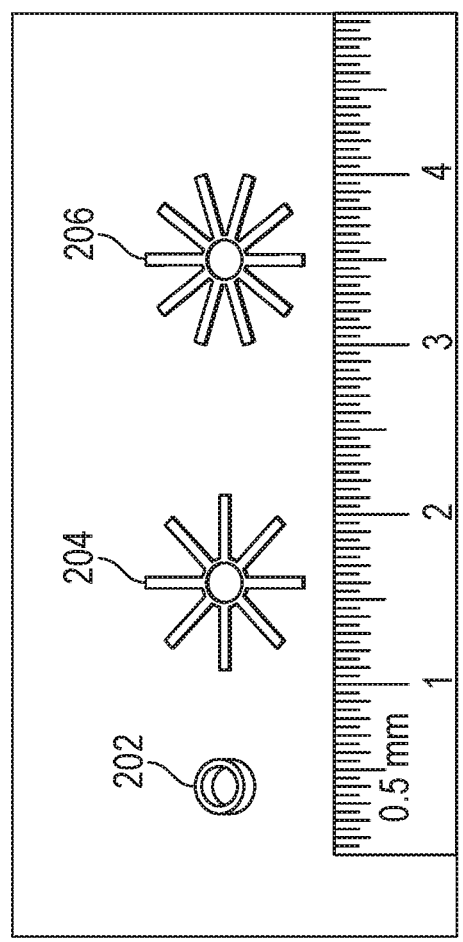
FIG. 2C illustrates example flexible substrates and relative dimensions.

FIG. 2A and FIG. 2B illustrate generally an example cross-sectional view and a perspective view of the flex-based transformer of FIG. 1B, respectively. Additionally, FIG. 2C illustrates example dimensions of the decapod flex 206 (with 10 extensions), octopod flex 204 (with 8 extensions), and a toroidal magnetic core 202. Referring to FIG. 2B, there is illustrated a perspective view 220 of the transformer 100 shown in FIG. 1B. For purposes of showing the conductive regions of the flex assembly, the dielectric layer (e.g., 208) is removed from FIG. 2B. A cross-sectional plane 250 in FIG. 2B is associated with the cross-sectional view illustrated in FIG. 2A.

Referring to FIG. 2A, the cross-sectional view illustrates an example comprising an arrangement of the transformer 100 including the flex 101 shown in FIG. 1A. Referring to FIG. 2A, more specifically, the flex can include a first conductive layer 206 (e.g., "M1"), a second conductive layer 210 (e.g., "M2"), and a dielectric layer 208. The dielectric layer 208 can be a polyimide (PI) layer or any other type of flexible dielectric (e.g., polyester, poly-ether-ether-ketone (PEEK), as further illustrative examples).

In an example, the first conductive layer 206 can include conductive traces on each of the planar extensions, which traces can be used to form the winding portions (e.g., P1 through P5 and S1 through S5) of the primary and secondary winding in the transformer 100. The second conductive layer 210 can include the plurality of solder pads 106 (e.g., a single solder pad can be connected to each planar extension). The flex 101 can also include connecting pads 214 (or 110), which can be used to connect the first conductive layer to the second conductive layer after a planar extension is folded over the magnetic core 202 (or 104). Additionally, a plurality of interconnects (or vias) 212 can be used throughout the flex 101 to electrically connect the first conductive layer 206 to the second conductive layer 208. The combination of the interconnects 212 and the connecting pads 214 allows for all winding portions (e.g., P1 through P5 for the primary and S1 through S5 for the secondary) to be electrically connected and to form the primary and secondary winding after all planar extensions are folded over the core and sealed with the connecting pads 214.

In an example, the magnetic core 202 can include an adhesive layer 216, which can be used for attaching the first conductive layer 206 when the planar extensions of the flex 101 are folded over the core 202.

FIG. 2D, FIG. 2E, FIG. 2F and FIG. 2G illustrate various views of another example flex-based transformer 261 that is different from the transformer in FIG. 1B. Referring to FIG. 2D, there is illustrated a flex 264 which can include a plurality of prongs wrapped around a magnetic core 262 to form windings of a transformer 261. A cross-sectional plane 260 provides the perspective and cross-sectional views 260 illustrated in FIG. 2F and FIG. 2G. As seen in FIG. 2F and FIG. 2G, the flex 264 is wrapped around the magnetic core 262 starting from an inside surface of the core 262 and wrapping around an outside surface of the core 262, with sealing portions 268 completing the transformer windings. The solder pads 266 are located on a core surface that is opposite the core surface with the sealing portions 268. The formation of the windings using the flex is similar to the transformer 100, however, the direction of the flex prong wrapping is opposite from the direction of wrapping used for transformer 100. The difference can be noted by referring to FIG. 4, where the core 405 is placed on a base portion 403 of the flex, and then each of the prongs is wrapped around the flex starting from an outside surface and then around an inside surface of the core.

Figure 3A:
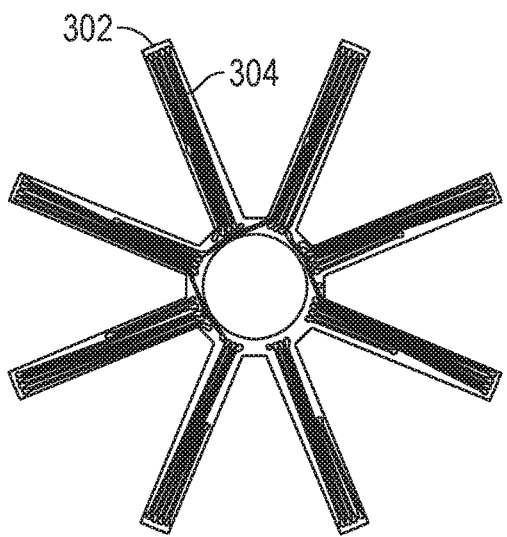
FIG. 3A, FIG. 3B, FIG. 3C, and FIG. 3D illustrate generally examples comprising layers of an octopod (8-prong) flex, which can be used in a flex-based transformer according to some examples.
Figure 3B:
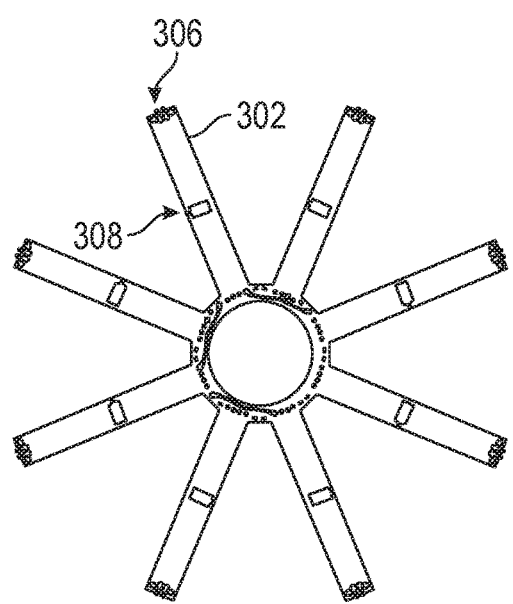
Figure 3C:
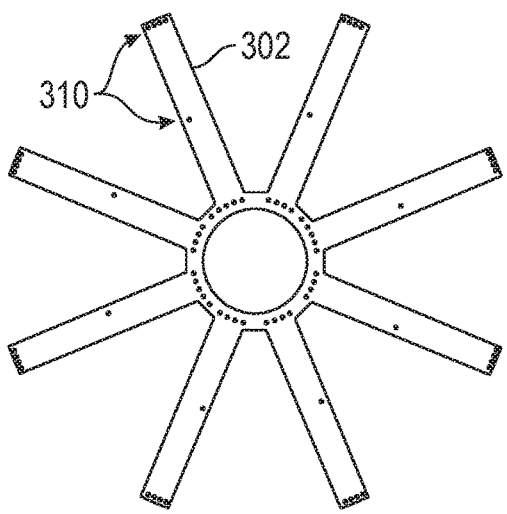
Figure 3D:
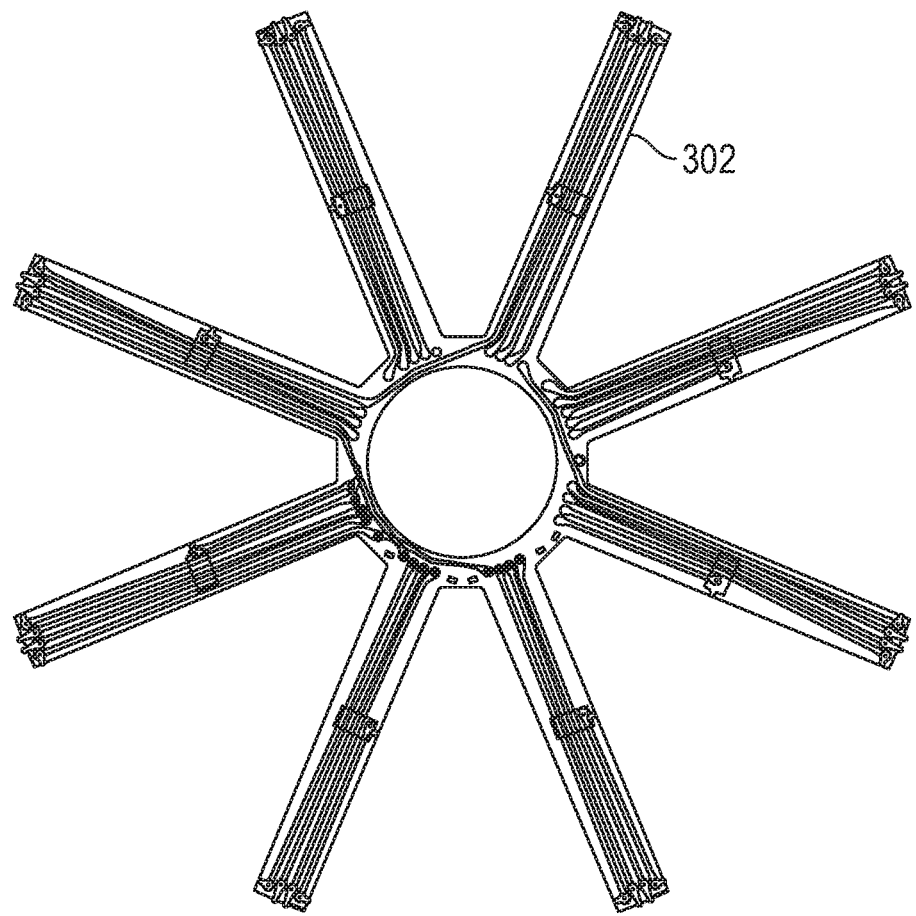

FIGS. 3A-3D illustrate generally examples including layers of an octopod (8-prong) flex, which can be used in a flex-based transformer according to some embodiments. More specifically, FIG. 3A illustrates an example first conductive layer of the flex 302. The first conductive layer can be similar to the first conductive layer 206 in FIG. 2A, and can include conductive traces 304 (e.g., metallic traces) on each planar extension. FIG. 3B illustrates an example comprising a second conductive layer of the flex 302. The second conductive layer can be similar to the second conductive layer 210 in FIG. 2A, and can include solder pads 308 (e.g., one solder pad per planar extension) and interconnects 306. FIG. 3C illustrates location of additional interconnects 310 of the flex 302. The interconnects 306 and 310 can include one or more vias and can be used for electrically connecting the first conductive layer to the second conductive layer at certain locations so that the primary and secondary winding can be formed after all planar extensions are folded over the core 202 and sealed with the connecting pads 214. FIG. 3D illustrates an example composite view of the views from FIGS. 3A-3C, showing the first conductive layer, the second conductive layer, and the interconnects for the flex 302.

Figure 4:
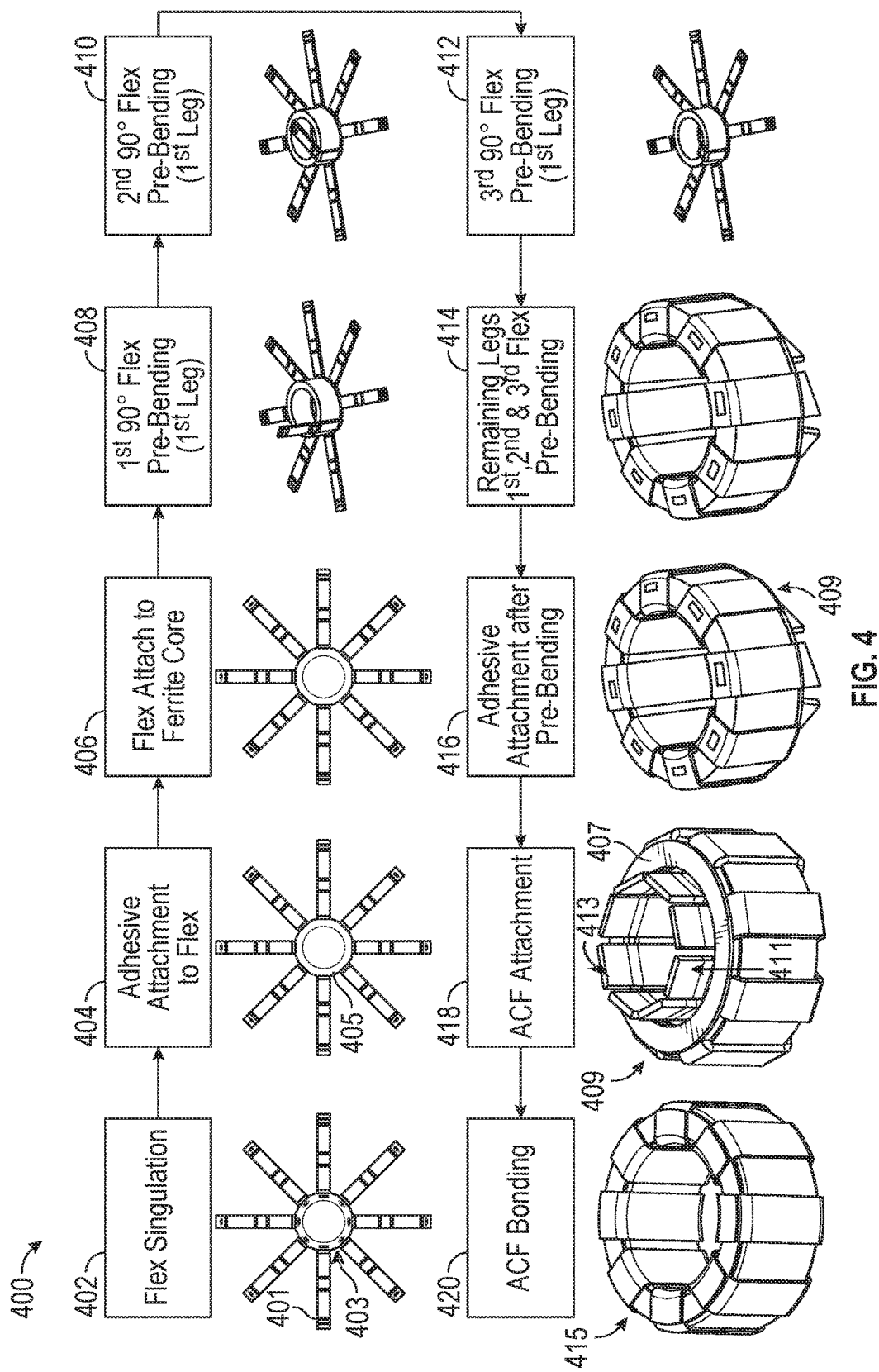
FIG. 4 illustrates generally a technique, such as a method, that can include manufacturing a flex-based transformer using an octopod flex in accordance with an example.

FIG. 4 illustrates generally a technique, such as a method, that can include manufacturing a flex-based transformer using an octopod flex in accordance with an example embodiment. Referring to FIGS. 1-4, the example method 400 may start at 402, when the flex 401 can be manufactured and singulated. The layered composition of flex 401 can be similar to the composition of flex 302, as illustrated in FIGS. 3A-3D. At 404, adhesive can be attached to flex 401. For example, an adhesive layer can be attached on the oval base portion 403 of the flex 401. At 406, the magnetic core 405 (e.g., a toroidal ferrite core) can be attached to the oval base portion 403 via the adhesive layer. At 408-412, a first planar extension (or leg) of the flex 401 can be pre-bent at 90° three consecutive times. At 414, the remaining planar extensions of the flex 401 can also be pre-bent at 90° three consecutive times. At 416, an adhesive layer can be attached on the circular surface 409, which is parallel to the oval base portion 403 of flex 401. At 418, anisotropic conductive film (ACF) 407 can be attached to the adhesive on surface 409.

In an example, the ACF 407 can be conductive in only one direction (e.g., direction 411). In this regard, after the unattached portions 413 of the planar extensions are folded over and attached to the ACF 407, the electrical connections for all windings formed by the flex can be attached, resulting in complete primary and secondary windings for transformer 415.

Figure 5:
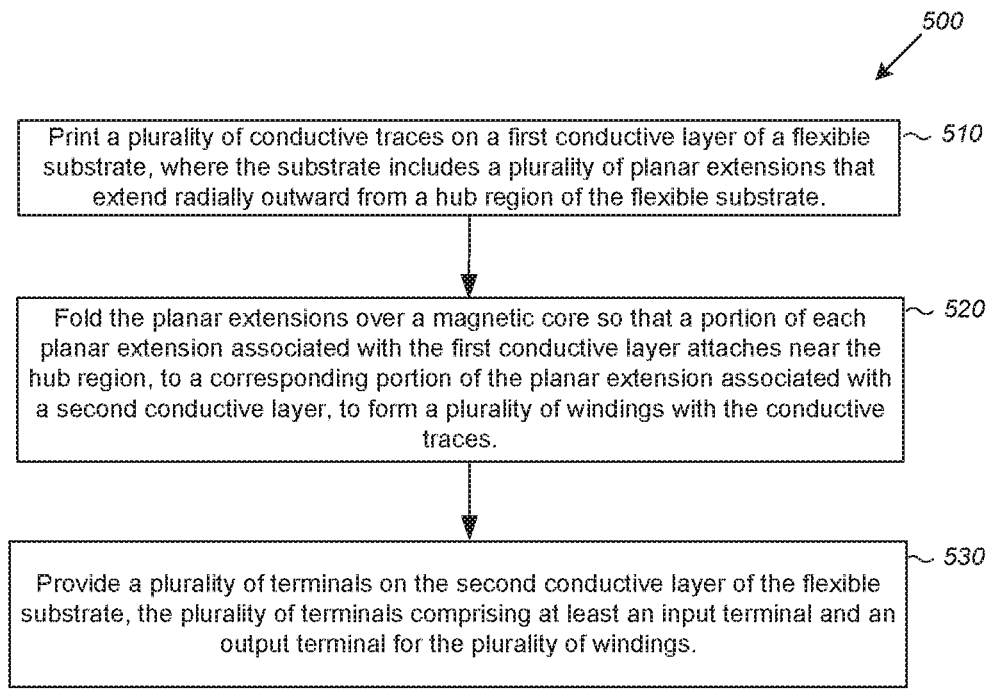
FIG. 5 illustrates generally another technique, such as a method, that can include manufacturing a flex-based transformer using a flexible substrate in accordance with an example.

FIG. 5 illustrates generally another technique, such as a method, that can include manufacturing a flex-based transformer using a flexible substrate in accordance with an example embodiment. Referring to FIG. 1A, FIG. 1B, FIG. 1C, FIG. 2A, FIG. 2B, FIG. 2C, FIG. 3A, FIG. 3B, FIG. 3C, FIG. 3D, and FIG. 5, the example method 500 may start at 510, when a plurality of conductive traces can be printed (or otherwise placed) on a first conductive layer of a flexible substrate (e.g., traces 304 can be placed on the first conductive layer of flex 302). The substrate (e.g., 302) includes a plurality of planar extensions that extend radially outward from a hub region (e.g., 403) of the flexible substrate. At 520, the planar extensions can be folded over a magnetic core (e.g., 405) so that a portion of each planar extension associated with the first conductive layer (e.g., portions 413) attaches near the hub region, to a corresponding portion of the planar extension associated with a second conductive layer (e.g., attachment to the second conductive layer via the ACF 409), to form a plurality of windings with the conductive traces. At 530, a plurality of terminals (e.g., solder pads 308) can be provided on the second conductive layer of the flexible substrate. The plurality of terminals can include at least an input terminal and an output terminal for the plurality of windings (e.g., I/O terminals for the primary and secondary winding, as well as one or more center tap terminals).

Various Notes & Examples

Example 1 can include or use subject matter (such as an apparatus, a method, a means for performing acts, or a device readable medium including instructions that, when performed by the device, can cause the device to perform acts), such as can include or use an inductive device, comprising: a flexible substrate having at least a first conductive layer and a dielectric layer; a core comprising a magnetic material; wherein a first planar extension of the flexible substrate is arranged to provide a first conductive winding encircling a cross section of the core, the first conductive winding defined at least in part on the first conductive layer when the first planar extension of the flexible substrate is folded over the core such that a portion of the first planar extension attaches back to another region of the substrate; wherein a second planar extension of the substrate, separate from the first planar extension of the flexible substrate, is arranged to provide a second conductive winding encircling the cross section of the core, the second conductive winding defined at least in part on the first conductive layer when the second planar extension of the flexible substrate is folded over the core such that a portion of the second planar extension also attaches back to another region of the substrate.

In Example 2, the subject matter of Example 1 optionally includes wherein the first conductive winding comprises a primary winding of a transformer; and wherein the second conductive winding comprises a secondary winding of the transformer.

In Example 3, the subject matter of any one or more of Examples 1-2 optionally include wherein the flexible substrate comprises a second conductive layer separated from the first conductive layer by the dielectric layer; and wherein the first conductive winding and the second conductive winding are defined at least part by the second conductive layer.

In Example 4, the subject matter of Example 3 optionally includes wherein locations where the substrate is attached to itself include electrical interconnections between the first and second conductive layers.

In Example 5, the subject matter of any one or more of Examples 1-4 optionally include wherein the magnetic material includes a relative magnetic permeability greater than unity.

In Example 6, the subject matter of any one or more of Examples 1-5 optionally include wherein the core comprises an unbroken toroid.

In Example 7, the subject matter of any one or more of Examples 1-6 optionally include wherein the substrate comprises a plurality of planar extensions arranged to provide respective windings encircling the core when the planar extensions are folded and attached back to another region of the substrate.

In Example 8, the subject matter of Example 7 optionally includes wherein adjacent windings are conductively isolated from each other.

In Example 9, the subject matter of Example 8 optionally includes wherein the respective windings comprise primary and second windings of a transformer; and wherein such windings are interleaved around a circumference of the core.

In Example 10, the subject matter of any one or more of Examples 7-9 optionally include wherein the planar extensions are arranged to extend radially outward from a hub region of the flexible substrate.

In Example 11, the subject matter of Example 10 optionally includes wherein the planar extensions each define a distal end; and wherein the respective distal ends attach back to the substrate at or near the hub region to encircle the cross section of the core.

Example 12 is a transformer, comprising: a flexible substrate having at least a first conductive layer and a dielectric layer; and an unbroken toroidal core comprising a magnetic material, wherein the magnetic material includes a relative magnetic permeability greater than unity, wherein the substrate comprises a plurality of planar extensions arranged to provide respective windings encircling the core when the planar extensions are folded and attached back to another region of the substrate, and wherein adjacent windings are conductively isolated from each other.

In Example 13, the subject matter of Example 12 optionally includes wherein the flexible substrate further comprises a second conductive layer separated from the first conductive layer by the dielectric layer; and wherein the first conductive layer and the second conductive layer are coupled via a plurality of interconnects so that the respective windings are formed when the planar extensions are folded and attached back to the another region of the substrate.

In Example 14, the subject matter of any one or more of Examples 12-13 optionally include wherein the plurality of interconnects comprise at least one of anisotropic conductive film (ACF), solder or conductive paste.

In Example 15, the subject matter of any one or more of Examples 12-14 optionally include wherein the second conductive layer further comprises a plurality of terminals, each terminal coupled to an input, an output or a center tap of a corresponding one of the windings.

Example 16 is a method of manufacturing an inductive device, the method comprising: printing a plurality of conductive traces on a first conductive layer of a flexible substrate, wherein the substrate comprises a plurality of planar extensions that extend radially outward from a hub region of the flexible substrate; folding the planar extensions over a magnetic core so that a portion of each planar extension associated with the first conductive layer attaches near the hub region, to a corresponding portion of the planar extension associated with a second conductive layer, to form a plurality of windings with the conductive traces; and providing a plurality of terminals on the second conductive layer of the flexible substrate, the plurality of terminals comprising at least an input terminal and an output terminal for the plurality of windings.

In Example 17, the subject matter of Example 16 optionally includes wherein the plurality of windings for a primary winding and a secondary winding of a transformer.

In Example 18, the subject matter of Example 17 optionally includes wherein the plurality of terminals comprises: an input and an output terminal for the primary winding; an input and an output terminal for the secondary winding; and a center tap terminal for one or both of the primary winding and the secondary winding.

In Example 19, the subject matter of any one or more of Examples 16-18 optionally include surface mounting the inductive device to an integrated circuit using the plurality of terminals.

In Example 20, the subject matter of any one or more of Examples 16-19 optionally include providing a plurality of interconnects on each planar extension of the flexible substrate, where the first conductive layer of the planar extension attaches to the second conductive layer near the hub region.

Each of the non-limiting examples described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An inductive device, comprising:
a flexible substrate having at least a first conductive layer and a dielectric layer;
a core comprising a magnetic material;
wherein a first planar extension of the flexible substrate is arranged to provide a first conductive winding encircling a cross section of the core, the first conductive winding defined at least in part on the first conductive layer when the first planar extension of the flexible substrate is folded over the core such that a portion of the first planar extension attaches back to another region of the substrate;
wherein a second planar extension of the substrate, separate from the first planar extension of the flexible substrate, is arranged to provide a second conductive winding encircling the cross section of the core, the second conductive winding defined at least in part on the first conductive layer when the second planar extension of the flexible substrate is folded over the core such that a portion of the second planar extension also attaches back to another region of the substrate, wherein the first conductive winding is conductively isolated from the second conductive winding within the flexible substrate.

2. The inductive device of claim 1, wherein the inductive device is a transformer, the first conductive winding comprises a primary winding of the transformer, and the second conductive winding comprises a secondary winding of the transformer.

3. The inductive device of claim 1, wherein the flexible substrate comprises a second conductive layer separated from the first conductive layer by the dielectric layer; and
wherein the first conductive winding and the second conductive winding are defined at least part by the second conductive layer.

4. The inductive device of claim 3, wherein locations where the substrate is attached to itself include electrical interconnections between the first and second conductive layers.

5. The inductive device of claim 1, wherein the magnetic material includes a relative magnetic permeability greater than unity.

6. The inductive device of claim 1, wherein the core comprises an unbroken toroid.

7. The inductive device of claim 1, wherein the substrate comprises a plurality of planar extensions arranged to provide respective windings encircling the core when the planar extensions are folded and attached back to another region of the substrate.

8. The inductive device of claim 7, wherein the first planar extension and the second planar extension are neighboring planar extensions among the plurality of planar extensions.

9. The inductive device of claim 7, wherein the respective windings comprise primary and second windings of a transformer; and
wherein such windings are interleaved around a circumference of the core.

10. The inductive device of claim 7, wherein the planar extensions are arranged to extend radially outward from a hub region of the flexible substrate.

11. The inductive device of claim 10, wherein the planar extensions each define a distal end; and
wherein the respective distal ends attach back to the substrate at or near the hub region to encircle the cross section of the core.

12. A transformer, comprising:
a flexible substrate having at least a first conductive layer and a dielectric layer; and
an unbroken toroidal core comprising a magnetic material, wherein the magnetic material includes a relative magnetic permeability greater than unity,
wherein the substrate comprises a plurality of planar extensions arranged to provide respective windings encircling the core when the planar extensions are folded and attached back to another region of the substrate, and
wherein adjacent windings provided on adjacent planar extensions of the plurality of planar extensions are conductively isolated from each other and are interleaved around a circumference of the core.

13. The transformer of claim 12, wherein the flexible substrate further comprises a second conductive layer separated from the first conductive layer by the dielectric layer; and
wherein the first conductive layer and the second conductive layer are coupled via a plurality of interconnects so that the respective windings are formed when the planar extensions are folded and attached back to the another region of the substrate.

14. The transformer of claim 12, wherein the plurality of interconnects comprise at least one of anisotropic conductive film (ACF), solder or conductive paste.

15. The transformer of claim 12, wherein the second conductive layer further comprises a plurality of terminals, each terminal coupled to an input, an output or a center tap of a corresponding one of the windings.

16. The transformer of claim 12, wherein the respective windings comprise primary and second windings of the transformer; and
wherein the adjacent windings comprise interleaved portions of the primary and secondary windings.

17. The transformer of claim 12, wherein the planar extensions are arranged to extend radially outward from a hub region of the flexible substrate.

18. A transformer, comprising:
a flexible substrate having at least a first conductive layer and a second conductive layer isolated from the first conductive layer, the flexible substrate including a plurality of planar extensions arranged to provide respective primary and secondary windings; and
a toroidal core comprising a magnetic material,
wherein the first conductive layer and the second conductive layer are coupled via a plurality of interconnects so that the respective primary and secondary windings are formed using the first conductive layer and the second conductive layer when the planar extensions are folded and attached back to another region of the substrate, and
wherein adjacent windings provided on adjacent planar extensions of the plurality of planar extensions are conductively isolated from each other and are interleaved around a circumference of the toroidal core.

19. The transformer of claim 18, wherein each of the adjacent windings include portions of the primary or the secondary windings provided on the adjacent planar extensions.

20. The transformer of claim 18, wherein the second conductive layer further comprises a plurality of terminals, each terminal coupled to an input, an output or a center tap of a corresponding one of the windings.

* * * * *

UNITED STATES PATENT AND TRADEMARK OFFICE
CERTIFICATE OF CORRECTION

PATENT NO. : 10,090,094 B2  
APPLICATION NO. : 15/174477  
DATED : October 2, 2018  
INVENTOR(S) : Bolognia et al.

Page 1 of 1

It is certified that error appears in the above-identified patent and that said Letters Patent is hereby corrected as shown below:

On page 2, in Column 2, under "Other Publications", Line 6, delete "Prrinted" and insert --Printed-- therefor On page 2, in Column 2, under "Other Publications", Line 34, delete "PCT IB2016 001629," and insert --PCT/IB2016/001629,-- therefor Signed and Sealed this  
Eighteenth Day of June, 2019

Andrei Iancu  
*Director of the United States Patent and Trademark Office*